(12) United States Patent
Perozziello et al.

(10) Patent No.: US 7,985,689 B2
(45) Date of Patent: Jul. 26, 2011

(54) PATTERNING 3D FEATURES IN A SUBSTRATE

(75) Inventors: Eric Perozziello, Half Moon Bay, CA (US); Thomas Joseph Kropewnicki, San Mateo, CA (US); Gregory L. Wojcik, Ben Lomond, CA (US); Andreas Goebel, Mountain View, CA (US); Claes Bjorkman, Los Altos, CA (US)

(73) Assignee: Applied Matrials, Inc., Santa Clara, CA (US)

( * ) Notice: Subject to any disclaimer, the term of this patent is extended or adjusted under 35 U.S.C. 154(b) by 774 days.

(21) Appl. No.: 11/763,199

(22) Filed: Jun. 14, 2007

(65) Prior Publication Data

US 2007/0293044 A1    Dec. 20, 2007

Related U.S. Application Data

(60) Provisional application No. 60/805,010, filed on Jun. 16, 2006.

(51) Int. Cl.
*H01L 21/302* (2006.01)
*H01L 21/461* (2006.01)

(52) U.S. Cl. .......... 438/706; 438/707; 438/725; 216/58; 216/83

(58) Field of Classification Search ........................ None
See application file for complete search history.

(56) References Cited

U.S. PATENT DOCUMENTS

| | | | |
|---|---|---|---|
| 6,313,171 B1 * | 11/2001 | Bok et al. | 514/568 |
| 6,759,281 B1 * | 7/2004 | Kim et al. | 438/149 |
| 7,439,187 B2 * | 10/2008 | Ono et al. | 438/717 |
| 2004/0165637 A1 | 8/2004 | Bullington et al. | |
| 2005/0230348 A1 * | 10/2005 | Kido | 216/58 |
| 2006/0067651 A1 | 3/2006 | Chui | |

* cited by examiner

*Primary Examiner* — Duy-Vu N Deo
(74) *Attorney, Agent, or Firm* — Kilpatrick Townsend & Stockton LLP

(57) ABSTRACT

Methods of forming a 3D structure in a substrate are disclosed. A layer of resist is deposited on the substrate. The layer of resist is patterned to define an edge at a predetermined location. The resist is reflowed to form a tapered region extending from the etch. Both the reflowed resist and the substrate are concurrently etched to transfer the tapered profile of the reflowed resist into the underlying substrate to form an angled surface. The etching is discontinued before all of the resist is consumed by the etching.

23 Claims, 7 Drawing Sheets

PATTERNING 3D FEATURES IN A SUBSTRATE

CROSS-REFERENCES TO RELATED APPLICATIONS

This application is a nonprovisional of, and claims the benefit of the filing date of, U.S. Prov. Pat. Appl. No. 60/805,010, entitled "Patterning 3D Features in a Substrate," filed Jun. 16, 2006 by Eric Perozziello et al, the entire disclosure of which is incorporated herein by reference for all purposes.

BACKGROUND OF THE INVENTION

Optical components are now being integrated in chips along side microelectronic components. An example of one such approach is described in U.S. Ser. No. 10/280,505, entitled "Optical Ready Substrates," incorporated herein by reference. Basically, it is a semiconductor wafer into which optical signal distribution network made up of optical waveguides, optical detectors, and other optical components has been fabricated in anticipation of the subsequent fabrication of microelectronic circuitry above the optical network. The optical sign distribution network is designed to carry optical signals (e.g. clock or data signals) to and from the microelectronic components that will be fabricated above the optical circuitry.

In general, the optical components that are used in these IC chips require smooth surfaces. For redirecting light, optical surfaces must also often have a smooth curvature or a smooth transition from one plane to another. Such surfaces must often be disposed at angles apart from planar surfaces often used in thin-film processing.

Previous researchers have attempted to make smooth dry etched surfaces at 45° from the sample surface with little success. Such attempts at dry etches generally involved a substantial flow of sidewall passivation gas combined with the etching gas to form a tapered sidewall.

Other optics groups have resorted to ordering specially cut off-axis crystalline wafers and using a crystal-plane-selective wet etch to achieve 45° sloped surfaces. The main problem is that it requires a non-standard wafer. Performing this etch using an off-the-shelf <100> oriented wafer will yield a 54.7° angle.

There continues to be a need for a process that provides greater control over the fabrication of these and other 3D features.

BRIEF SUMMARY OF THE INVENTION

Thin-film techniques are well developed for controlling features on the substrate's surface and the orthogonal surface. To form optical surfaces apart from these two planes requires non-conventional thin-film techniques. The two components discussed herein (i.e., a lens and a mirror) use a technique of polymer (photoresist) reflow to form a tapered or shaped mask, and a subsequent etch process that consumes both the substrate and the mask at pre-defined relative rates. The tapered mask edge then imparts its shape, in some manner, to the underlying substrate.

Some of the lens-related embodiments described herein improve upon prior art techniques by combining the use of resist reflow for lenses in silicon with techniques for tuning the radius of curvature. The angle of the lens generated by the reflow process is due in large part to the contact angle resulting from the surface tension between the film and the substrate. By modifying the size of the photoresist mask and/or by modifying the surface, it is possible to influence the contact angle and hence the shape of the lens or other feature being patterned. Additionally, for the pattern transfer process, gas ratio tuning in the process of etching lenses in silicon, including one or more primary silicon etch gases (such as $Cl_2$, $SF_6$, $NF_3$, HCl, HBr, or other halogen containing gas) and one primary photoresist etch gas (such as $O_2$, $H_2O$ or other oxidizing gases) is used to tune curvatures of the lenses being etched.

It is highly desirable to minimize the amount of change introduced when optimizing a new process or when compensating for other minor fluctuations in the process flow. With a simple tuning of only the relative ratio of process gases, radii of curvature in silicon lenses have been demonstrated ranging from 100 µm to 1 mm, having diameters in-plane ranging from 100 µm to 500 µm.

In a first set of embodiments, a method is thus provided for forming a 3D structure in a substrate. A layer of resist is deposited over the substrate. The layer of resist is patterned to define an edge at a predetermined location. The resist is reflowed to form a tapered region extending from the edge. Both the reflowed resist and the substrate are concurrently etched to transfer the tapered profile of the reflowed resist into the underlying substrate so as to form an angled surface. The etching is discontinued before all of the resist is consumed by the etching.

In some of these embodiments concurrently etching comprises dry etching. For example, a remainder of the resist on the substrate may be removed after discontinuing etching. An etch stop layer may be deposited over the substrate, with the etch stop layer being patterned to form an opening about the predetermined location. In one embodiment, the resist is patterned by forming the edge within the opening formed in the etch stop layer.

The resist and substrate may be concurrently etched by etching the resist with a first etchant and etching the substrate with a second etchant different from the first etchant. The first etchant might comprise an oxidizing gas and the second etchant might comprise a halogen-containing gas. Concurrently etching the resist and substrate may be performed with an etch chemistry that achieves an initial preselected resist:substrate etch ratio in such instance, the etch chemistry might be changed as the etching proceeds to change the resist:substrate etch ratio.

In a second set of embodiments, methods are provided of fabricating a mirror in a substrate. A layer of resist is deposited over the substrate. The layer of resist is patterned to define an edge at a predetermined location. The resist is reflowed to form a tapered region extending from the edge. Both the reflowed resist and the substrate are concurrently etched to transfer the tapered profile of the reflowed resist into the underlying substrate to form an angled surface. A coating is deposited on the angled surface to form the mirror.

In some of these embodiments, an etch stop layer is deposited over the substrate and the etch stop layer is patterned to form an opening about the predetermined location. The resist may be patterned by forming the edge within the opening formed in the etch stop layer.

Sometimes, the concurrent etching may form a cavity in the substrate. In such cases, the cavity may be filled with a fill material and the substrate planarized after filling the cavity until the etch stop layer is reached; the etch stop layer may then be removed.

The coating may comprise a dielectric. Concurrently etching the resist and substrate may comprise etching the resist with a first etchant and etching the substrate with a second etchant different from the first etchant. The first etchant might comprise an oxidizing gas and the second etchant might comprise a halogen-containing gas. In some instances, the concurrent etching is performed with an etch chemistry that achieves an initial preselected resist:substrate etch ratio, which may be changed as the etching proceeds by changing the etch chemistry.

In one embodiment, the substrate has an upper surface and an optical waveguide fabricated beneath the upper surface of the substrate. The concurrent etching then continues until the angled surface intersects the optical waveguide.

The details of one or more embodiments of the invention are set forth in the accompanying drawings and the description below. Other features, objects, and advantages of the invention will be apparent from the description and drawings, and from the claims.

DETAILED DESCRIPTION OF THE INVENTION

Fabricating a Lens

Figure 1:
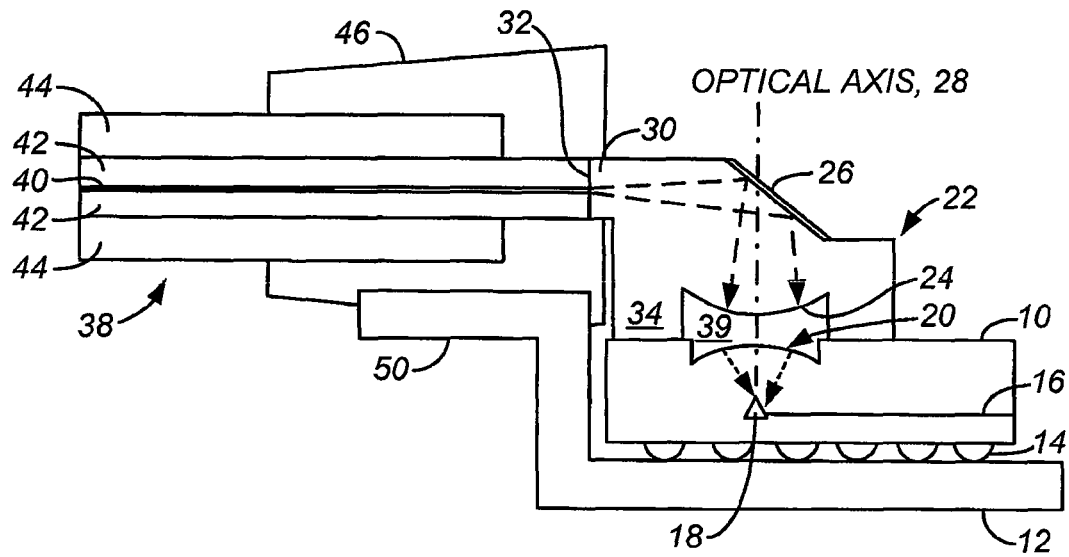
FIG. 1 is a schematic representation of a backside lens and mirror to couple light into and out of optical circuitry that has been fabricated in an IC chip.

FIG. 1 shows a circuit assembly which includes a silicon IC chip 10 with a lens 20 formed on its back surface in order to provide a way to couple optical signals into and out of the optical circuitry that is fabricated on the chip. IC chip 10 is flip-chip mounted onto a chip carrier 12 by means of a ball grid array (BGA) 14. Using known techniques, such as those described in U.S. Ser. No. 10/280,492 entitled "Optical Ready Wafers," an optical waveguide 16 has been fabricated on the front side of the chip. Waveguide 16 is either fabricated in a layer within the chip that is at the same level as other microelectronic (e.g. CMOS) circuitry (not shown) that is also fabricated on the front side of the chip or it is in a layer that is buried beneath the level in which the microelectronic circuitry resides. Optical waveguide 16 represents an optical signal distribution network that serves to distribute optical clock signals or other optical signals to and/or from the microelectronic circuitry. At one end of optical waveguide 16 there is a mirror 18 fabricated within the waveguide. Mirror 18 serves either to redirect an optical signal coming through the backside of the chip into the waveguide or to redirect optical signals from the optical waveguide out of the backside of the chip. On the backside of chip 10 there is a focusing lens 20 that has been fabricated as an integral part of the chip. Lens 20 is aligned with mirror 18 having lithographic registration accuracy, e.g. better than 0.5 micron typical on an ASML backside alignment stepper.

Affixed to the backside of chip 10 and in alignment with lens 20 is a surface mount optical coupler 22. It is an integrally fabricating structure that includes: a collimating lens 24; a mirrored surface 26 angled 45° relative to the optical axis 28 of collimating lens 24; a short, rod-shaped extension 30 which has a flat optical surface 32 at its exposed end, and a cylindrically-shaped support or tube extension 34 which supports and aligns the subassembly against the backside of chip 10. Butted against flat surface of extension 30 is an optical fiber pigtail 38 that characteristically includes a fiber core 40, surrounded by fiber cladding 42 which is, in turn, surrounded by a fiber buffer layer 44 that protects the inner structure. A polymer boot 46 surrounds the end of optical fiber pigtail 38 and part of extension 30 and serves both to provide a means of anchoring the assembly to an extension arm 50 of chip carrier 12 and to protect the optical fiber from being damaged during handing. When lens subassembly 22 is mounted on the backside of chip 10, it aligns its collimating lens 24 with focusing lens 20 and maintains them at a predetermined distance from each other with an intermediate air gap 39 separating them.

A diverging light beam from optical fiber pigtail 38 enters collimating subassembly 22 through optical surface 32 of extension 30 and contacts angle mirrored surface 26 which redirects the beam downwards towards collimating lens 24. Collimated light (or substantially collimated light, though it need not be collimated) from lens 24 passes through air gap 39 and into focusing lens 20 which focuses the collimated beam into optical waveguide 16 via mirror 18. Mirror 18 redirects the focused beam into optical waveguide 16.

This structure is described in greater detail in U.S. Ser. No. 11/354,267 entitled "Optical Coupling to IC Chip," filed Feb. 14, 2006, incorporated herein by reference. Of course, this structure is just one example of many alternative ways of employing an integral lens and/or mirrors for directing light into or out of waveguides or other optical devices or structures. The methods described herein present ways of fabricating those lens and mirror elements.

The backside silicon lens is fabricated by a using photoresist pattern and reflow process followed by employing a transfer etch to etch both photoresist and silicon. The ending profile is a purely silicon lens, which in this case is depressed below the surface of the substrate.

Using standard methods, photoresist may be patterned in a variety of shapes, depending upon the desired outcome. For example, a cylindrical shape may be patterned in photoresist to produce a spherical shape after reflow of the photoresist. The radius of curvature of the lens is due in large part to the contact angle that the photoresist coating forms with the substrate and the thickness of the photoresist.

There are at least two methods for reflowing photoresist, namely, thermal and solvent vapor (e.g. acetone). In the case of thermal reflow, the photoresist is deposited and then caused to reflow to achieve the desired shape by heating. Thermal reflow uses the inherent fluidic properties of the resist. It is a very stable and controllable process. The edges of the resist are pinned. One simply melts the resist and allows the surface to reshape itself under the influence of surface tension and gravity. In essence, the shape and contact angle of the reflowed resist depends upon the thickness and size of the original photoresist mask before reflow is performed and it is easier to predict what the final profile will be. In the case of an acetone reflow, the contact angle of the reflowed resist on a substrate may be also modified by introducing a thin film coating on the substrate (e.g. $Si_3N_4$ or $SiO_2$ on silicon) to engineer the interfacial properties, and hence, the angle of the resulting pattern. An acetone reflow tends to promote wetting of the silicon surface and therefore the spreading of the photoresist beyond the originally patterned surface area. Acetone reflow adds at least one additional variable to the process and in comparison to thermal reflow tends to result in a process that is more difficult to control. In other words, thermal reflow has an advantage due to the lack of wetting of the developed resist on the silicon surface. For the embodiments described herein, thermal resist reflow is used. But it should be understood that the inventions described herein are intended to also cover other methods of reflow including solvent reflow.

Figure 2:
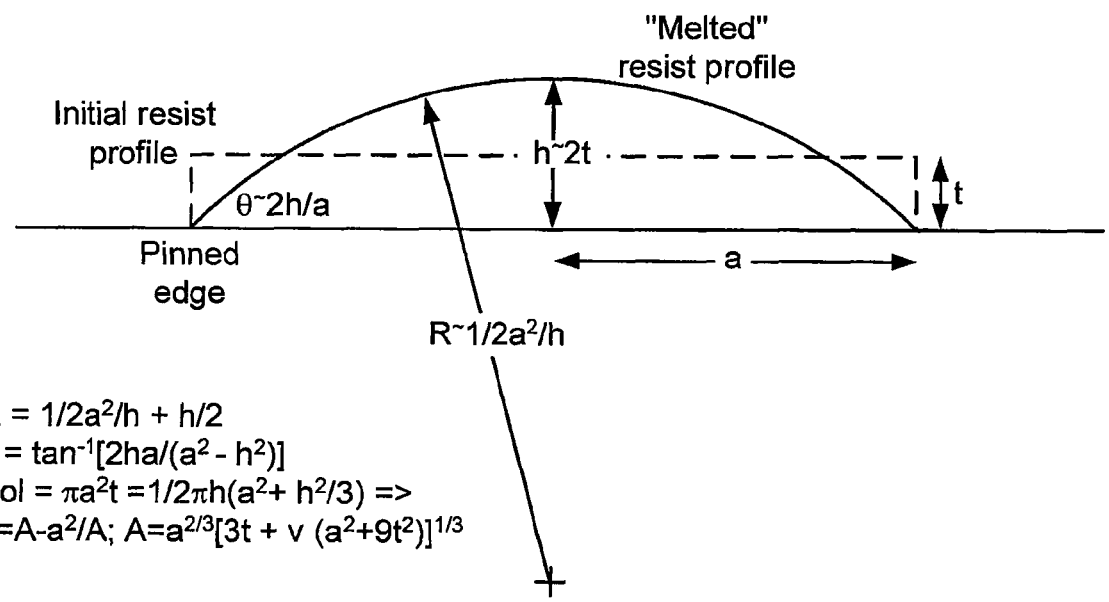
FIG. 2 shows a spherical cap approximation for the thermal reflow of photoresist.

For thermal reflow the spherical cap approximation shown in FIG. 2 is helpful for predetermining the desired radius of curvature in the lens to be patterned. In that example, the patterned resist is in the shape of a cylinder with a radius of "a" and a thickness of "t". Upon heating, the resist will reflow under the influence of surface tension to form a spherical surface with its lower edge pinned to the location of the original patterned resist. The curvature, R, of the resulting surface is:

$$R = \frac{1}{2}\frac{a^2}{h} + \frac{h}{2}$$

and the angle (or slope) of the edge of the mask is:

$$\theta = \tan^{-1}\left[\frac{2ha}{a^2 - h^2}\right].$$

In other words, the way to control final curvature of the lens is through the diameter of the printed feature and thickness of the resist. For example, a 200µ diameter resist mask which has a thickness of 7µ yields a radius of curvature of 400µ in resist, which results in the same radius in silicon when using a 1:1 etch selectivity.

The resulting spherically-shaped photoresist serves as an eroding mask which when etched away using the appropriate etch chemistry can be used to transfers its shape into the underlying substrate. In the described embodiment, the etch that is performed is a dry etch that is, for example, performed in a plasma etch chamber.

Once the photoresist has been patterned and reflowed, the resist pattern is transferred to the underlying silicon with an etch chemistry that has the appropriate selectivity between the photoresist and the silicon. That is, the resulting spherically shaped photoresist serves as an eroding mask, the spherical pattern of which is transferred into the underlying substrate. If the etch chemistry is selected so that it etches the photoresist at the same rate it etches the silicon, the exact spherically shaped profile of the resist will be transferred directly into the silicon when etching is complete. By using an etch chemistry that etches photoresist and silicon at different rates, the resulting shape that is transferred into the silicon will diverge from the spherical profile of the photoresist mask. The etch chemistry might for example use an oxidizer, such as $O_2$, to etch the photoresist and a halogen containing gas, such as $Cl_2$, HBr, $SF_6$, or $NF_3$, among others, to etch the silicon. Other gas chemistries include $CF_4$ and $NF_3/O_2$.

Figure 3:
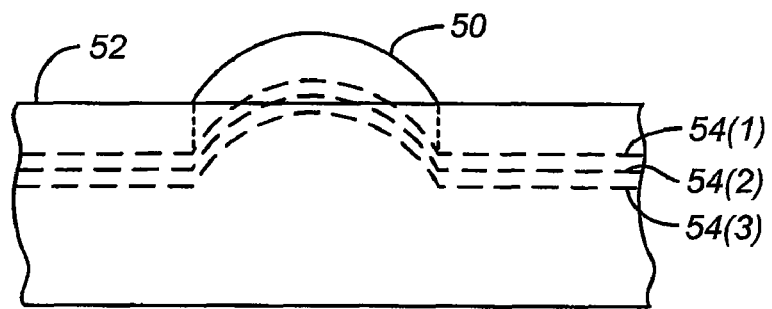
FIG. 3 illustrates the etch process that is used to form a lens in a substrate.

The transfer of the pattern into the substrate is illustrated in FIG. 3. After patterning and reflow has taken place, an eroding mask 50 will have been formed on the surface of substrate 52 (e.g. silicon). Once the etching process begins, the etchant gases start to consume both the substrate and the eroding mask. The exposed regions of substrate begin to etch away immediately while regions that are protected by an overlying eroding mask will not be exposed to the etch chemistry until the eroding mask above those regions are gone. The first portions of the eroding mask to be fully consumed are the thinner regions around the periphery of the mask. As soon as they are gone, the etchant gases will begin to etch away the underlying, recently exposed substrate. But by the time this happens the exposed regions of the substrate that has already felt the effect of the etchant gases during the time that the eroding mask was being consumed have etched away. One can readily see that as the etching process proceeds, the profile of the overlying eroding mask will gradually be cut into the underlying substrate. So, for example, after some period of etching has been allowed to take place, the profile that is etched into the substrate will appear as shown by reference numeral 54(1). The outer circumference of the lens will begin to form around a flat region that is still protected by the resist. At a later time represented by 54(2), the flat region will be smaller and more of the profile of the outer periphery of the lens will appear. Finally, when the resist as been fully consumed as shown by reference numeral 54(3), the entire profile of the resist will have been transferred into the substrate and the lens will be fully formed. Continuing to etch will simply drive the profile deeper into the substrate.

In short, as the etch proceeds the curvature of the "lens" of photoresist is gradually transferred to the substrate. Not until the entire island of photoresist has been consumed by the etchant gases will the lens will have been completely transferred to the silicon. So, this process of lens formation requires that the entire island of photoresist be consumed by the etch.

One has the ability to tune the radius of curvature of the lenses that are etched into the silicon by selecting the ratio of oxidizer to halogen gas that is used during the process. Thus, for example, if a gas mixture is used that produces an etch rate of the resist that is greater than the etch rate of the silicon, the resulting lens that is etched into the substrate will have a greater radius of curvature. That is, the profile of the resist will tend to flatten out as it is etched into the silicon. Conversely, if the etch rate of the resist is less than the etch rate of the silicon, the resulting lens that is etched into the substrate will have smaller radius of curvature.

In addition, by changing the etch gas chemistry during the etch process it is also possible to fabricate an aspheric lens relative to the optical axis of the lens. That is, the shape or radius of curvature can be changed as a function of the depth of the etch. For instance, the etch chemistry that is used at the beginning of the process might etch photoresist at a slower rate than it etches the silicon substrate. During the etch process that chemistry can be changed so that it progressively moves a chemistry which etches the photoresist more quickly than the silicon. By appropriately changing the etching properties as a function of time one can modify the shape of the resulting lens away from its original spherical shape to an aspherical shape. Thus, for example, a lens having a parabolic cross-section could be produced with this method.

Figure 4:
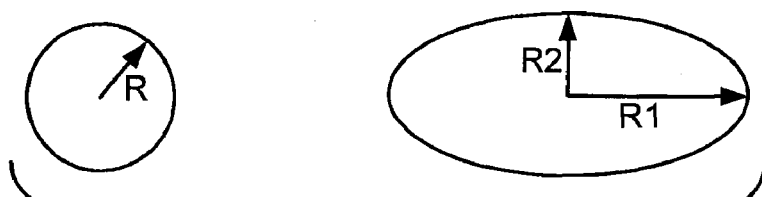
FIG. 4 shows a circular area of photoresist for forming a spherical lens and an elliptically shaped area of photoresist for forming a lens having at least two different radii of curvature.

Another modification of the process can produce a lens having different radii of curvature in different directions. Referring to FIG. 4, instead of starting with a cylindrical layer of resist having a circular cross-section, one could use an elliptically shaped layer of resist (i.e., with an elliptical cross-section). Upon thermal reflow of the lens, the resulting curved surface would have different curvatures relative to the two orthogonal axes of the lens. The resulting lens that is transferred to the silicon would also have an identical shape (assuming of course that a resist:silicon etch ratio of 1:1 is used). Such a shape would be particularly useful for beam shaping and could be used with a waveguide that emits a beam shape that is not circularly symmetrical.

It should be noted that this technique can be combined with the above-described technique for altering curvatures in the lens axis direction to more completely control the lens shape.

Fabricating a Mirror

The above-described techniques can also be used, with modification, to fabricate into silicon mirrors having a selectable slope. In general, this is accomplished by putting a taper on the edge of the resist mask and then etching that taper into the underlying silicon. The slope of the mask edge in combination with the selectivity of the etch between the mask and the underlying material are the two control parameters which enables one to select the final slope of the angled surface that is etched into the underlying substrate. By selecting the appropriate etch ratio (i.e., etch rate of resist to etch rate of substrate) one can tune in the desired angle of the resulting angled surface that is produced by the etch.

Figure 5A:
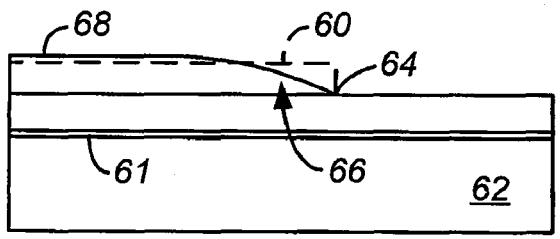
FIGS. 5A-B illustrate how a tapered edge eroding mask is sued to fabricate a mirror.
Figure 5B:
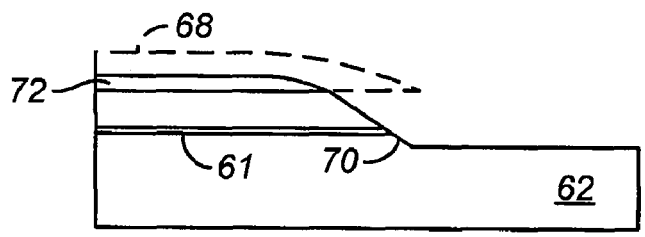

FIGS. 5A-B illustrate the process. In this example, a layer of photoresist 60 is deposited on a substrate 62 (e.g. a silicon wafer) in which there is a buried optical waveguide 61. An opening is patterned into it thereby defining an edge 64 along the patterned resist. The substrate is then heated to thermally reflow the resist under the influence of surface tension to form a tapered mask region 66 having its edge pinned at edge 64. After forming the mask 68 with tapered mask region 66, the structure is etched using a gas mixture (e.g. Cl$_2$/HBr) that etches both the resist and the silicon in accordance with a selected ratio. The etch selectivity (i.e., resist:silicon etch rates form the gas chemistry) is typically selected so that the silicon etches more quickly than the resist, e.g. 1:3. In contrast, in the case of lens fabrication, the etch selectivity will probably be closer to 1:1.

As the mask erodes during the etch process, its tapered profile at is edge is transferred to the underlying substrate. This is illustrated by FIG. 5B which shows part of the tapered mask that has been transferred to the etched substrate to fabricate an angled surface 70. The original mask 68 is shown with the dashed outline and the eroded mask 72 that is present at this particular stage of the etch process is shown with solid lines. The result is an etched surface 70 that has a particular slope, the angle of which is determined by both the angle of the tapered mask edge as well as the resist:silicon etch ratio associated with the particular gas chemistry that is used.

Figure 6:
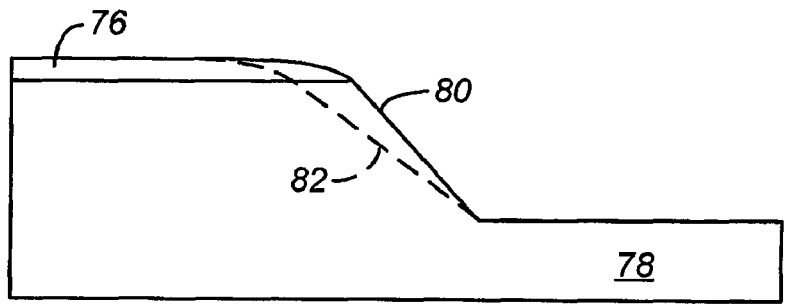
FIG. 6 illustrates how using different etch rate ratios (resist: silicon) produces angled surfaces of different slopes.

By controlling etch selectivity, one can control the mirror angle. The difference in angle between the reflowed photoresist edge and the resultant angle in the silicon is determined by the material selectivity of the etch process, which can be tuned by varying the ratio of the two types of etch gasses. For example, as illustrated by FIG. 6, using a gas chemistry that yields a higher etch rate in the mask 76 as compared to the substrate 78 produces the angled surface labeled by reference number 80. In contrast, using a gas chemistry that yields a lower etch rate in the mask as compared to the substrate produces the angled surface labeled by reference number 82. In the later case, the silicon etches more slowly as compared to the first case thereby producing a mirror surface with a less steep angle.

Figure 7:
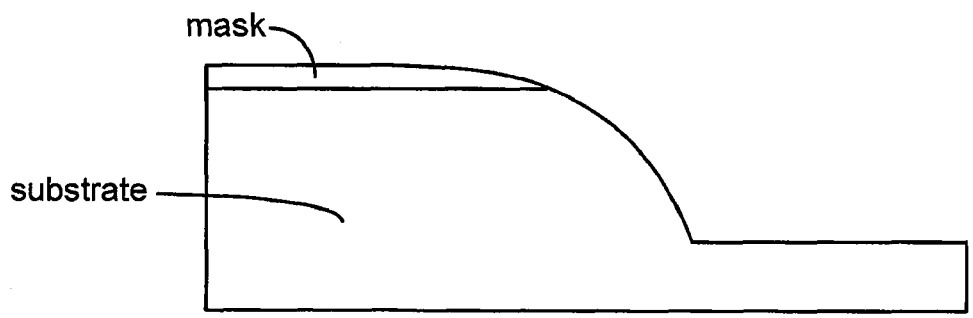
FIG. 7 illustrates how to fabricate curved mirror surfaces by varying the etch rate ratios during the etch process.

As illustrated by FIG. 7, one can also change the etch selectivity as a function of time (or, equivalently, as a function of the depth of the etch) to affect different shapes of the resulting etched surface. In the example illustrated by FIG. 7, the etch ratio of the gas mixture (i.e., resist:silicon) decreases as the etch progresses. So, at the early phases of the process the silicon etches more quickly than the resist as compared to at later stages of the process. This produces an etched surface with a steeper angle near the bottom and a shallower angle near the surface. In other words, the resulting etched surface has a concave curvature. This concave surface can function as a focusing mirror.

By reversing order of the process, i.e., by progressing from a lower etch ratio to a higher etch ratio, a surface with the opposite curvature can be formed. In other words, this later process would produce a convex curvature, which could be used as a defocusing mirror.

Note that if there is a slight curvature to the underlying etched surface and that curvature is not desired, it can be tuned out by controlling the gas ratios in a manner similar to what was just described. The cross-sectional shape of the mirror can be completely controlled in this manner to any desired shape.

By curving the mask edge in the plane of the surface, it is also possible to fabricate a mirror with in-plane curvature. For example, referring to FIG. 8, the tapered edge 90 of the overlying resist 92 is curved as shown, i.e., convex. When the tapered edge is transferred into the underlying silicon, the resulting mirror is characterized by an in-plane curvature. Such a mirror can be used for focusing in that plane, i.e., the plane of its curvature. Of course, the edge could be cured in a concave direction to produce a curvature of the opposite sign.

Figure 8:
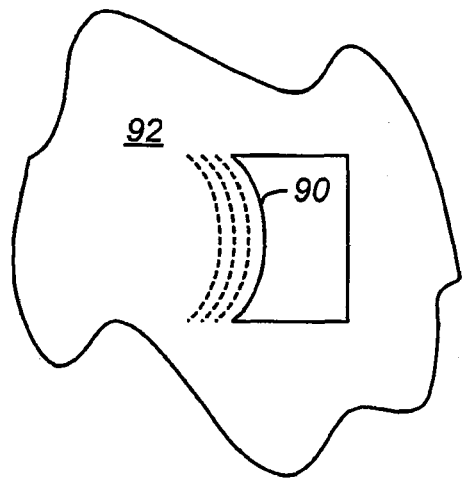
FIG. 8 illustrates a mask for producing a mirrored surface with an in-plane radius of curvature.

It should be understood that the technique illustrated by FIG. 8 can be combined with the previously described technique for producing curvature in the other direction (see FIG. 7) to achieve more complete control of the resulting mirror shape.

Figure 9A:
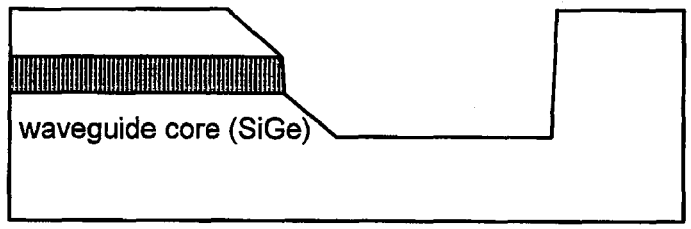
FIGS. 9A-B illustrate the effects of a variable etch rates as a function of the material on which the etch chemistry is acting.
Figure 9B:
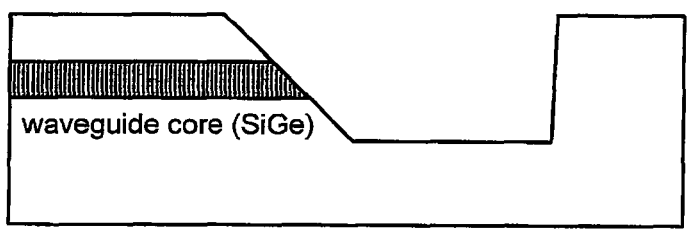

Referring to FIGS. 9A-B, the materials through which the etch is to be performed are likely to be inhomogeneous, which will typically mean that they characterized by different etch rates when exposed to the same gas chemistry. So, for example, in the case of a silicon substrate 100 with a buried optical waveguide 102 having a core that is made of SiGe, it is desirable to form the mirror surface so that it is aligned with the core. This means that the etch needs to proceed down through the overlying silicon, through the SiGe core and into the underlying silicon. During this process, the etch gas will see two different materials, namely, silicon and SiGe, each of which has a different etch rate when exposed to the same gas chemistry. If a constant gas chemistry is used throughout the etch process, the slope of the angled surface will change when the etch passes through the SiGe core. If the etch rate of SiGe is higher that that for Si then the resulting profile will look like what is shown in exaggerated form in FIG. 9A.

To maintain a constant angle, the gas chemistry is changed when the SiGe material is reached so as to produce an etch selectivity to photoresist in the SiGe that is equal to the etch selectivity that was previously obtained for the overlying Si. The resulting etched surface, assuming the gas chemistry is changed correctly and that change is timed correctly, will be as shown in FIG. 9B.

The correct gas chemistry can be determined empirically and at the appropriate time the change to the new gas chemistry can be effected. There are different ways to establish the correct timing. One is closed loop approach which uses an endpoint detection system (commonly referred to as Optical Emission Spectroscopy) to detect the composition of the material that is being etched. Such capability now exists in commercially available etch systems such as the "Eye-D" endpoint system available from Applied Materials. In a Si/SiGe waveguide structure when the endpoint detection system detects the presence of Germanium, indicating that the optical core has been reached by the etch, the gas chemistry is changed to produce an etch selectivity in (resist:SiGe) that is similar to the etch selectivity in (resist:Si). Since the size of the optical core in the waveguide is extremely small, the signal to noise ratio of the resulting detection signal might be too small for effectively detecting the change in the material being etched. This can be addressed by including test regions on the wafer that are much larger in area and thus generate a larger signal when the SiGe core layer is reached during the etch process, i.e., when the composition of the material being etched changes.

Another way to address this problem is an open loop approach according to which one empirically determines when the etch will reach the SiGe core and then simply changes the etch chemistry when that time in the etch process is reached. In that case, the change in gas chemistry is simply implemented at a particular time in the overall the etch process.

Reflow Edge Angle Control

As noted above, the reflow processes produce sloped edges in the photoresist. Though this sloped edge is controllable, if the edge is one boundary of layer that is effectively semi-infinite in extent, it requires very careful monitoring of many stages of the resist processing to achieve that control. An edge that terminates a semi-infinite plane of resist will continue to reflow (and thus change angle) under elevated temperature until the resist cross-links or otherwise hardens.

Figures 10A, 10B, 10C:
FIGS. 10A-C illustrate the use of narrow line widths of resist to control the taper angle at the edge of the resist pattern.

Another way to control the edge angle of the mask is to use a finite-width line of resist, as shown in FIGS. 10B and C. A finite width line will reflow until a cylindrical "cap" is formed, and then it will cease to reflow or change angle. Unlike reflowing resists of a layer of semi-infinite extent, this process is very highly controllable.

FIGS. 10A-C show the mask edges achieved for a semi-infinite region of reflowed material versus the mask edges achieved for finite-width lines of different widths. The slope of the mask edge in the former case changes as a function of time. So, it is essential to stop the reflow process at the right time of the edge slope will be lost. In contrast, the slope of mask edge for the finite width lines achieve equilibrium states (i.e., final values) that depend primarily on the starting mask thickness and line widths. With the same thickness of resist, a narrow line produces a steeper slope than the broader line. The mathematics for computing the edge angle is similar to the mathematics described above in connection with the spherical lens mask.

Figure 11:
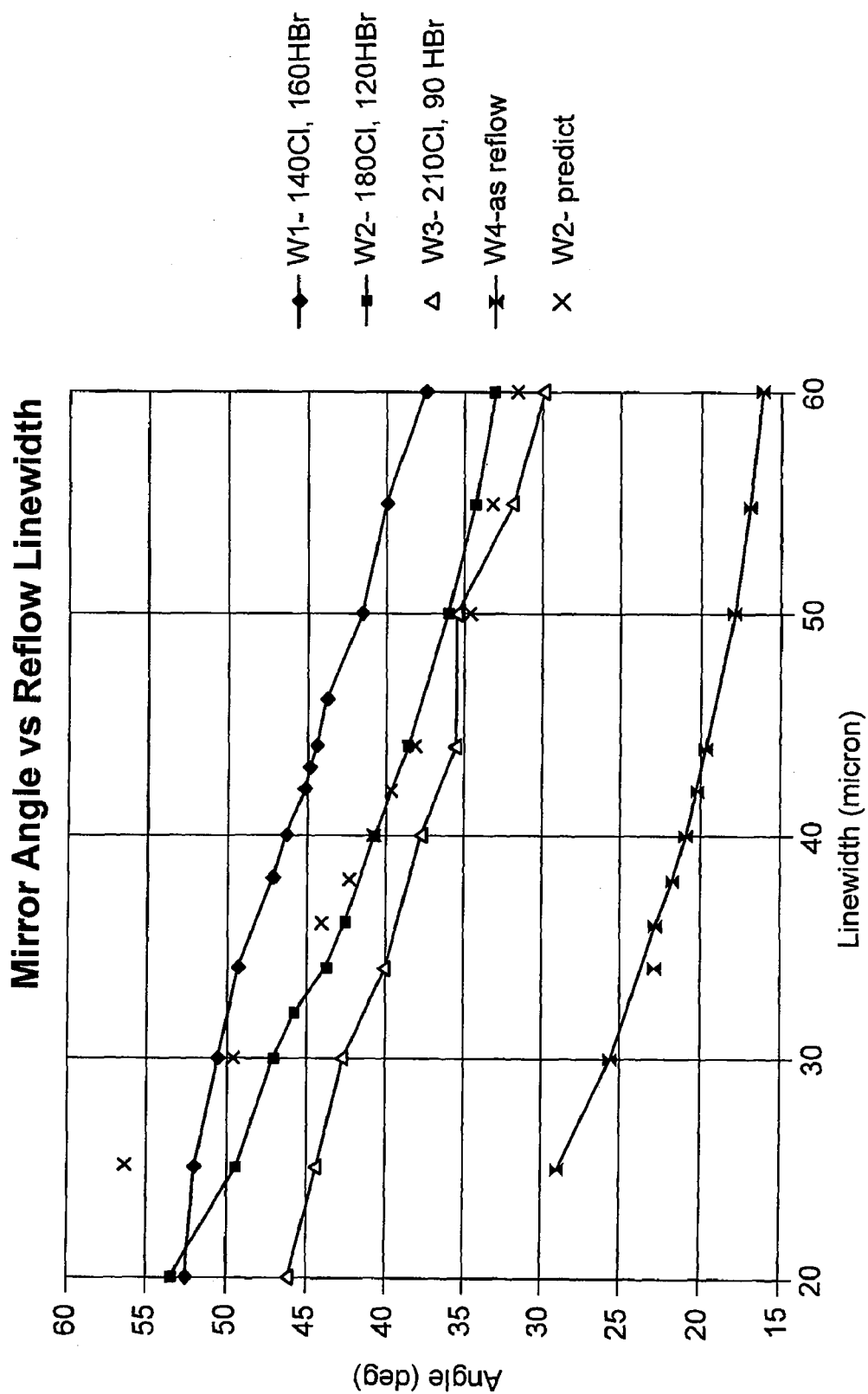
FIG. 11 is a graph of mirror angle versus line widths and gas chemistry.

FIG. 11 presents empirical data showing how the mirror angle can be controlled by both the etch chemistry and the line widths that are used. The graph shows the mirror angle on the vertical axis versus line width on the horizontal axis for three different mixtures of Cl and HBr. Among the upper three lines, the bottom line (identified by the symbol Δ), the gas flows were 210 sccm of $Cl_2$ gas and 90 sccm of HBr gas. As can be seen, by using a line width of about 24 microns, one can get a 45° angle. For the middle line (identified by the symbol ■), 180 sccm of $Cl_2$ gas and 120 sccm of HBr gas was used. In that case, by using a line width of about 33 microns, one get a 45° angle. And for the upper line (identified by the symbol ♦), the gas flows were 140 sccm of $Cl_2$ gas and 160 sccm of HBr gas and by using a line width of about 43 microns, one can get a 45° angle.

Note that the bottom plot in FIG. 11 presents is the angle in the starting resist and the plot marked by the symbol x presents an estimate of the predicted angle of the etched surface with an etch chemistry yielding a 1:3 etch ratio.

For all three mixtures, it is clear that a mirror angle of 45° can be precisely achieved by matching the line width with that particular mixture of gases. The curves are both smooth and repeatable. In addition, it is clear that the gas ratio can be used for fine tuning the angle.

The resulting edge angle is relatively invariant to various process parameters such as time of reflow, temperature of reflow, and ramp rate of temp. That means, one does not have to control those parameters very carefully, which is particularly good for production repeatability. The one parameter that does make a good tuning knob in the reflow is the line width of the printed feature. This is excellent, because if there's one thing the semiconductor industry has learned to control really well, it's line width (critical dimension).

Figures 12A, 12B:
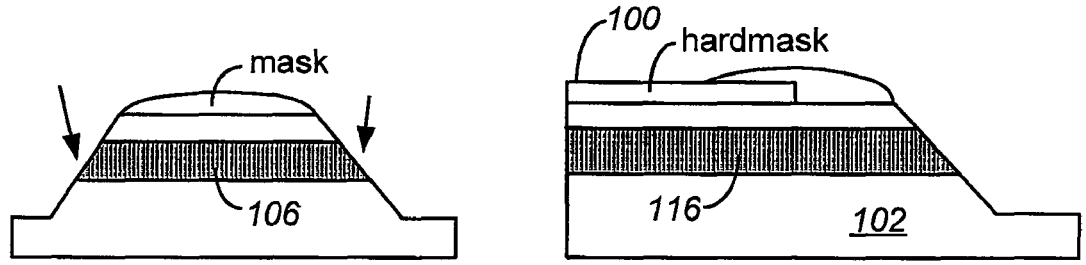
FIGS. 12A-B illustrate how to use a hard mask to prevent the formation of unwanted mirror surfaces.

A negative aspect of using finite line widths is that two opposing mirror surfaces are necessarily formed, one on each side of the finite width line as indicated by the arrows in FIG. 12A. Both mirror surfaces bisect the underlying waveguide. This is undesirable for many applications, especially ones that couple optical signals into a long waveguide.

In order to overcome this problem, a two-stage mask is employed. First, a hard mask 100, e.g. a nitride or oxide, is deposited onto the surface of the wafer 102, as illustrated in FIG. 12B. Then, hard mask 100 is etched away in the target region to expose the underlying substrate. The target region is the region in which the mirror will be formed along the buried optical waveguide 106. Next, a finite width line of resist 108 is formed having one edge in the opened target region and another edge located above hardmask 100. In other words the hard mask extends under the eroding mask. Reflow is then performed in the normal manner, followed by the etch process to form the mirror. Hardmask 100 prevents etching of the second, unwanted mirror surface, allowing only the desired mirror surface to be formed. After the desired mirror surface has been formed, the remaining photoresist and the hardmask are removed by using conventional, well-known methods.

The hard mask should be thin relative to the photoresist so as to have minimal impact on photoresist as it is being spun on. A thick hard mask can have negative impact on radial flow of resist as it is being spun on causing radial non-uniformities.

Compensating for Variations in Resist Thickness

There is typically a variation in etch rate across the wafer. That variation might be about 1-2%. However, the uniformity in the etched 3D structure lens depends on the difference in etch ratios that are used to fabricate that structure (i.e., the resist:substrate etch ratio). And it has been observed that the variation in the etch ratio or etch selectivity is much less. So, even though absolute etch rates vary across the wafer, the important parameter, namely the ratio between the two etch rates does not vary nearly as much.

Nevertheless, despite the best efforts of etch technology, large diameter substrates exhibit other non-uniformities that will effect the angle of the etched surface. For example, the profile of the resist mask will vary from the center to the edge of the wafer due to variations in the thickness of the resist across the wafer due to how the resist is put onto the wafer. So, one can end up with angle variation across the wafer due to normal variations in the thickness of the resist. Fortunately these variations are measurable and predictable. So, to compensate for this, different linewidths are used for the finite-width, thermal reflow defined masks. In other words, intentional lithography variations (e.g. line width trimming) are used to cancel unwanted mask thickness variations. Thus, mirrors on chips located at the edge of the wafer use different linewidths than mirrors on chips located near the center of the wafer.

In other words, the width of the line is used as a tuning parameter. If the photoresist is thinner near the edge of the wafer as compared to the center of the wafer, this will result in the slope at the edge of the resist being smaller, thereby producing a different angle of the etched surface. Using narrower mask lines near the edge of the wafer will compensate for the effect caused by the thinner photoresist. As noted above, assuming a constant thickness of resist, making the mask line narrower will result in a steeper slope at the mask edge. But since the resist is also thinner the line thickness can be selected to exactly compensate for the effect of the thinner resist.

By using such a technique, one can compensate for any systematic non-uniformities that occur over the face of the wafer.

Because the wafer is lithographically exposed by stepping and repeating a small die feature many times on a wafer, one way to implement the idea described above is to change the photomasks as a function of what region of the wafer is being exposed. For regions neared the edge the line thicknesses in the photomask that is used would be smaller. But that would be an expensive solution both in terms of cost and throughput.

Figure 13:
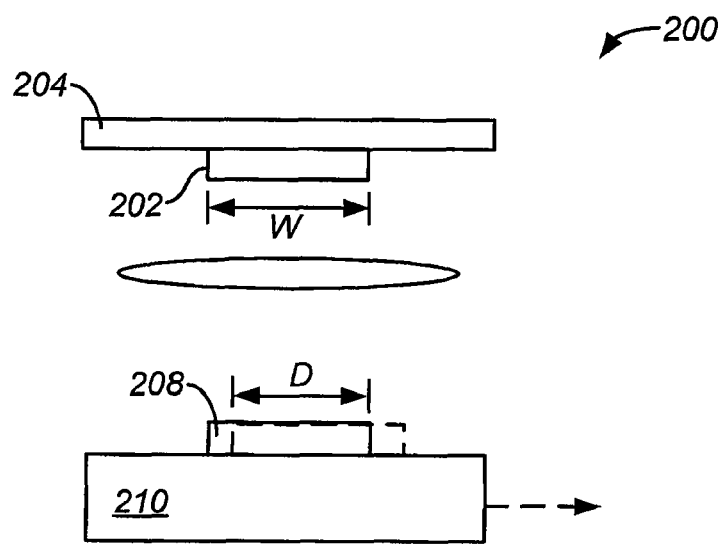
FIG. 13 illustrates how to trim the line widths near the edge of the wafer to compensate form non-uniform thickness of the photoresist.

Referring to FIG. 13, an alternative is to use the photolithographic stepper system 200 to trim lines by double exposing dies with a different offset to set a final developed linewidth. According to that approach, a line 202 is drawn on a mask 204 which has a width W that corresponds to the widest linewidth needed to form the widest desired reflow (shallowest angle) on the wafer 210. In other parts of the wafer, where a narrower reflow width is desired, the pattern is projected onto the photoresist 208 and exposed once, after which wafer 210 is moved an amount equal to the difference between the drawn (widest) line and the desired linewidth at this location, and exposed again, thus forming an unexposed region (in the case of positive photoresist) in the resist having a width D that is equal to the desired linewidth at this location on the wafer. Thus, the photoresist used for reflow is "trimmed" by an offset and a double-exposure technique using a photolithographic stepper machine.

The precise overlap used in the double exposure is the tuning parameter. Different shifts are used for different dies on the wafer, depending on how close they are to the edge of the wafer. If a positive tone photoresist is used, the resultant linewidth on the wafer is smaller than the mask linewidth by the amount of the shift between the two exposures.

For example, the mask may use a 40μ line width for making mirrors. However, near edges of wafer one uses double exposure with slight shift in the location of the mask to produce narrower line widths (e.g. 39μ), thereby compensating for the thinned resist.

Backfill of the Mirror Cavity

Etching the mirror on the frontside of a semiconductor wafer leaves a large cavity (e.g. it is typically several microns deep for many optical applications). For use in certain applications, such as the optical ready substrate applications described in U.S. Ser. No. 10/280,505, the surface of the wafer needs to be flat. The presence of any trenches or unfilled holes such as are caused by etching a mirror may potentially interfere with subsequent planar or CMOS processing. Thus, such a cavity as is produced when the mirror is formed must be filled and planarized in order to continue processing. The challenge in filling this cavity is finding a low-stress, easily deposited, thick material which can be planarized by conventional Chemical Mechanical Polishing (CMP), without disturbing the remaining silicon outside of the cavity. For example, if $SiO_2$ is used as the fill material, that is not particularly amenable to CMP removal.

Figure 14A:
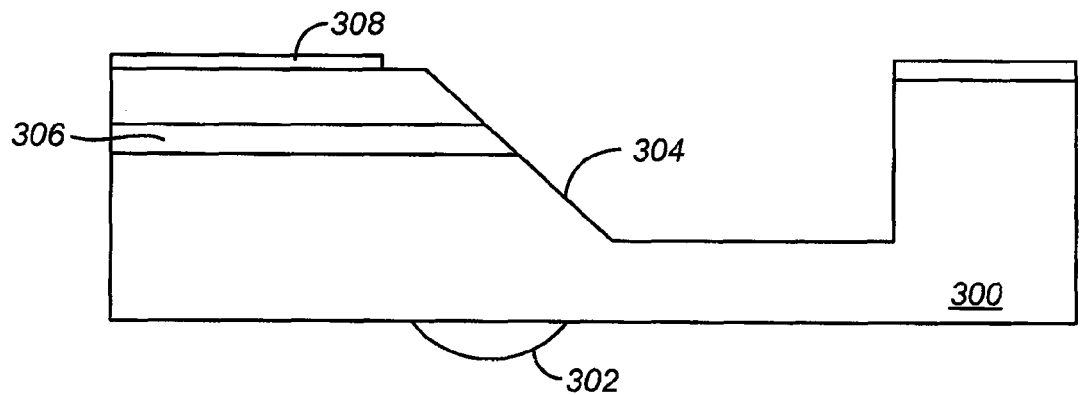
FIGS. 14A-E illustrate a process for filling the mirror cavity in preparation for subsequent microelectronic fabrication processing.
Figure 14B:
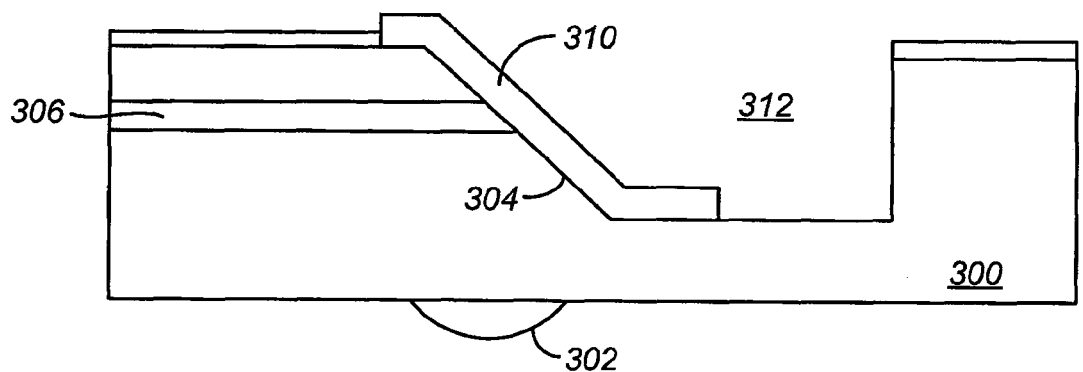

One solution is illustrated in FIGS. 14A-E. These drawings show a substrate 300 having a lens 302 formed on the backside and an optical waveguide 306 that had been previously formed in substrate 300. To fabricate the angled surface 304 that is to form the mirror that along waveguide 306 and aligned with lens 302, a thin nitride CMP stop layer 308 is deposited on the wafer. That stop layer is then patterned to remove it in the vicinity of where the mirrors are to be fabricated (FIG. 14A). Next, an angled surface 304 is etched into the silicon in the opening using the techniques described above (i.e., using a photoresist line with a tapered edge profile that is etched into the underlying wafer). After angled surface 304 has been etched, a thin layer of $SiO_2$ layer 310 (or some other dielectric layer with a contrasting index of refraction) is grown or deposited on the etched angled surface 304. It need be only thick enough to satisfy the reflectivity requirements of the mirror. Then, oxide layer 310 is patterned using a thick photoresist process and a wet etch to remove the oxide layer everywhere except generally in the area of angled surface 304. This leaves a cavity 312 that need to be filled (see FIG. 14B).

Figure 14C:
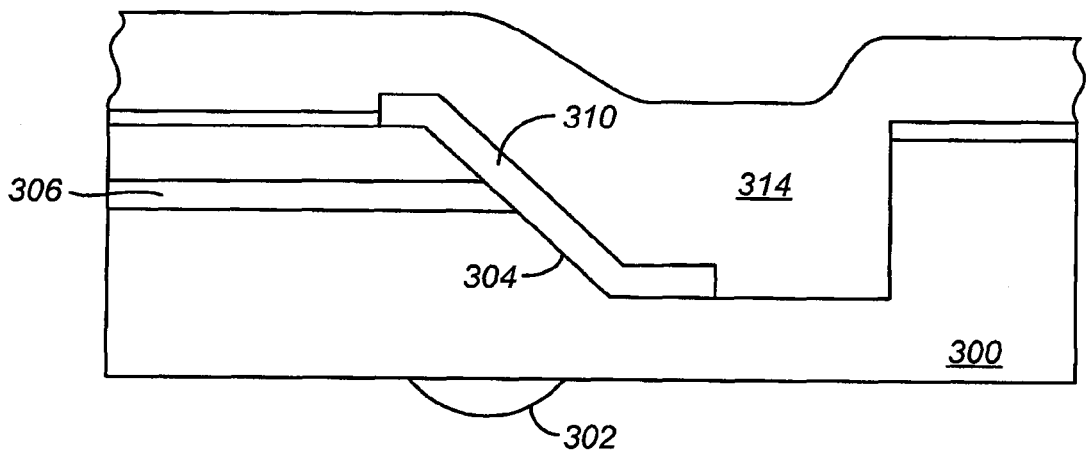
Figure 14D:
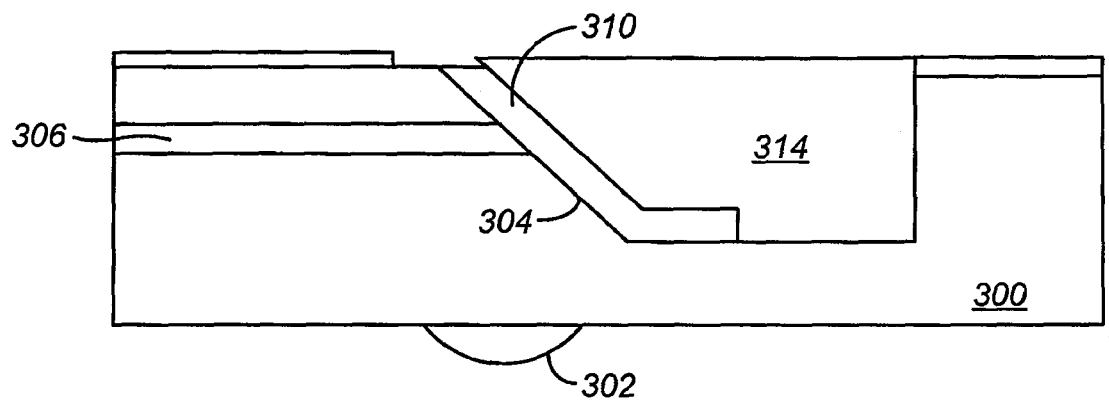
Figure 14E:
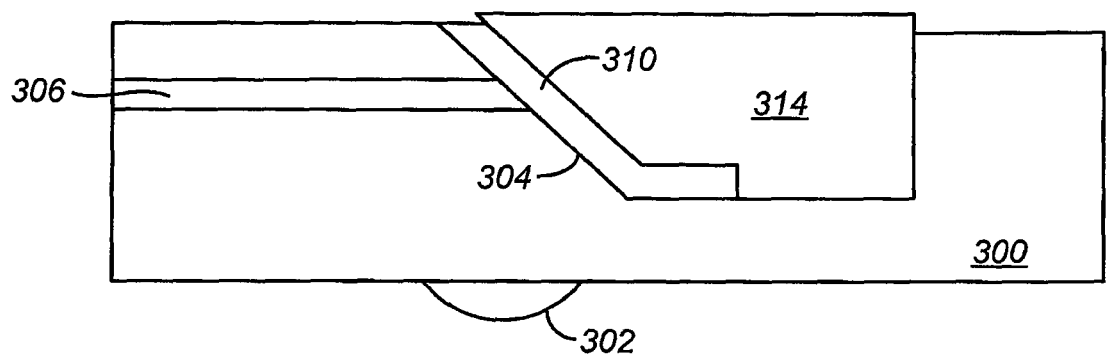

So, after oxide layer 310 has been patterned, silicon 314 is grown or deposited to fill (or overfill) cavity 312 (see FIG. 14C). A selective epitaxial process can, for example, be used to accomplish this with the result that it tends to minimize the CMP that is later required to planarize the surface. After the cavity has been filled, CMP is then performed to polish off silicon 314 level with the surface of nitride stop layer 308 thereby exposing stop layer 308 (see FIG. 14D). Additionally, to simplify the CMP process, the polishing of silicon fill material 314 may be optimized for silicon, even though oxide 310 may not be flattened. Then, a wet oxide etch is preformed to recess oxide 310 below the surface of the silicon. The exposed nitride layer 308 is then stripped away (see FIG. 14E). This leaves an exposed corner of $SiO_2$ that can be removed through a final touch CMP polish. Because the exposed corners are so small relative to the area of the wafer surface, CMP can easily remove them.

Other embodiments are within the following claims. For example, with regard to the lens though it was shown as being formed as a recessed lens, by etching the surrounding surface it can also be fabricated so that it extends above the surface. In addition, though embodiments involving a lens and a mirror have been described, the techniques described herein can be used to fabricate other useful 3D features within a substrate.

Also note that any etch parameters can be varied to achieve the tuning that was described above (including for example pressure, power, bias, and wafer temperature). Varying gas ratios might be the simplest method conceptually.

What is claimed is:

1. A method of forming a 3D structure in a substrate, the method comprising:
   depositing a layer of resist over the substrate;
   patterning the layer of resist to define an edge at a predetermined location;
   reflowing the resist to form a tapered region extending from the edge, using a thermal reflow process;

concurrently etching both the reflowed resist and the substrate to transfer the tapered profile of the reflowed resist into the underlying substrate so as to form an angled surface; and discontinuing etching before all of the resist is consumed by the etching.

2. The method recited in claim 1 wherein concurrently etching comprises dry-etching.

3. The method recited in claim 2 further comprising removing a remainder of the resist on the substrate after discontinuing etching.

4. The method recited in claim 2 further comprising:
depositing an etch stop layer over the substrate; and
patterning the etch stop layer to form an opening about the predetermined location.

5. The method recited in claim 4 wherein patterning the resist comprises forming the edge within the opening formed in the etch stop layer.

6. The method recited in claim 2 wherein concurrently etching comprises etching the resist with a first etchant and etching the substrate with a second etchant different from the first etchant.

7. The method recited in claim 6 wherein the first etchant comprises an oxidizing gas.

8. The method recited in claim 6 wherein the second etchant comprises a halogen-containing gas.

9. The method recited in claim 2 wherein concurrently etching comprises etching with an etch chemistry that achieves an initial preselected resist:substrate etch ratio.

10. The method recited in claim 9 wherein concurrently etching comprises change the etch chemistry as etching proceeds to change the resist:substrate etch ratio.

11. The method recited in claim 2 wherein patterning the layer of resist comprises forming a line of resist.

12. A method of fabricating a mirror in a substrate, the method comprising:
depositing a layer of resist over the substrate;
patterning the layer of resist to define an edge at a predetermined location;
reflowing the resist to form a tapered region extending from the edge, using a thermal reflow process;
concurrently etching both the reflowed resist and the substrate to transfer the tapered profile of the reflowed resist into the underlying substrate to form an angled surface; and
depositing a coating on the angled surface to form the mirror.

13. The method recited in claim 12 further comprising:
depositing an etch stop layer over the substrate; and
patterning the etch stop layer to form an opening about the predetermined location.

14. The method recited in claim 13 wherein patterning the resist comprises forming the edge within the opening formed in the etch stop layer.

15. The method recited in claim 13 wherein concurrently etching forms a cavity in the substrate, the method further comprising:
filling the cavity with a fill material;
planarizing the substrate after filling the cavity until the etch stop layer is reached; and
removing the etch stop layer.

16. The method recited in claim 13 wherein the coating comprises a dielectric.

17. The method recited in claim 13 wherein concurrently etching comprising etching the resist with a first etchant and etching the substrate with a second etchant different from the first etchant.

18. The method recited in claim 17 wherein the first etchant comprises an oxidizing gas.

19. The method recited in claim 17 wherein the second etchant comprises a halogen-containing gas.

20. The method recited in claim 13 wherein concurrently etching comprises etching with an etch chemistry that achieves an initial preselected resist:substrate etch ratio.

21. The method recited in claim 20 concurrently etching comprises change the etch chemistry as etching proceeds to change the resist:substrate etch ratio.

22. The method recited in claim 13 wherein patterning the layer of resist comprises forming a line of resist.

23. The method recited in claim 13 wherein:
the substrate has an upper surface and an optical waveguide fabricated beneath the upper surface of the substrate; and
concurrently etching continues until the angled surface intersects the optical waveguide.

* * * * *